United States Patent [19]
Clayton et al.

[11] Patent Number: 5,335,194
[45] Date of Patent: Aug. 2, 1994

[54] SAMPLE RATE CONVERTER

[75] Inventors: John C. Clayton, Buckinghamshire; Trevor N. Scofield, Berkshire, both of England

[73] Assignee: Innovision Limited, Slough, England

[21] Appl. No.: 992,433

[22] Filed: Dec. 17, 1992

[30] Foreign Application Priority Data

Mar. 14, 1992 [GB] United Kingdom ............... 9205614

[51] Int. Cl.⁵ .............................................. G06F 15/31
[52] U.S. Cl. ................................ 364/724.1; 364/724.16
[58] Field of Search ......................... 364/724.1, 724.16

[56] References Cited

U.S. PATENT DOCUMENTS

| | | | |
|---|---|---|---|
| 4,020,332 | 4/1977 | Crochiere et al. | 364/724.1 |
| 4,270,026 | 5/1981 | Shenoi et al. | 364/724.1 |
| 4,302,631 | 11/1981 | Shenoi et al. | 364/724.1 |
| 4,460,890 | 7/1984 | Busby | 364/724.1 |
| 4,472,785 | 9/1984 | Kasuga | 364/724.1 |
| 4,748,578 | 5/1988 | Lagadec et al. | 364/724.1 |
| 5,204,827 | 4/1993 | Fujita et al. | 364/724.1 |

FOREIGN PATENT DOCUMENTS

| | | |
|---|---|---|
| 0390531 | 10/1990 | European Pat. Off. |
| 0423921 | 4/1991 | European Pat. Off. |
| 2474797 | 7/1981 | France . |
| 2240684 | 8/1991 | United Kingdom . |
| WO91/19393 | 12/1991 | World Int. Prop. O. |
| WO93/07712 | 5/1993 | World Int. Prop. O. |

OTHER PUBLICATIONS

By H. Urkowitz, "Parallel Realizations of Digital Interpolation Filters for Increasing the Sampling Rate", Feb. 1975, pp. 146–154, vol. CAS-22, No. 2.
By R. Crochiere et al., "Optimum FIR Digital Filter Implementations for Decimation, Interpolation, and Narrow-Band Filtering", Oct. 1975, pp. 444–456, vol. ASSP-23, No. 5.

*Primary Examiner*—David H. Malzahn
*Attorney, Agent, or Firm*—Young & Thompson

[57] ABSTRACT

A sample rate converter comprises a first finite impulse response digital filter which effects a sampling rate doubling operation, which has a relatively large number of taps and whose output is connected to a second FIR digital filter having a relatively low number of variable coefficient taps. The frequency response of the first FIR digital filter is arranged to compensate for the frequency response of the second FIR digital filter.

10 Claims, 4 Drawing Sheets

SAMPLE RATE CONVERTER

BACKGROUND OF THE INVENTION

1. Field of The Invention

This invention relates to a sample rate converter; such a sample rate converter may be suitable for performing sample-rate conversion between the sampling frequencies associated with digital video formats.

2. Description of the Prior Art

It is known to provide a sample rate converter based on the following theory. The sampled signal, represented as a sequence of unit impulses $\delta_k = \delta(t-kT)$ where k is an integer and T the sampling period, modulated by the continuous signal being sampled x(t), may be shown to consist of infinitely many repetitions of the spectrum of x(t), centred on multiples of the sampling frequency (see FIG. 5, line $a$). It follows that, provided the Nyquist criterion has been satisfied so that the repeat spectra do not overlap, application of a suitable low-pass filter response, such as that shown in FIG. 5, line $b$, to this sampled signal will allow only the baseband spectrum to be passed, and the original continuous signal to be recreated. This process therefore allows the instantaneous value of this original signal to be precisely determined at any arbitrary point between samples, as is necessary when a different sampling rate is introduced due to the non-coincidence of sample times within the two sampling structures. Using the method of the convolution integral, the low-pass filter function may be applied to the sampled data. This integral, generally expressed as:

$$y(t) = \int_{\infty}^{\infty} x(\tau) \cdot h(t - \tau) \cdot d\tau$$

is shown diagramatically in FIG. 6, where in the case of the ideal low-pass response illustrated in FIG. 5, the corresponding impulse response $h(t-\tau)$ is the sinc(x) function shown. The integral allows the reconstructed continuous signal y(t) to be produced for any arbitrary value of t by integrating the product of the sampled signal and the symmetrical time-reversed impulse response, shifted to be centred on the point t where y(t) is to be reconstructed. This integral is evaluated in the sampled case by merely summing the products of the sample values at each sample point and the corresponding value of the impulse response at the same point.

Although this would involve an infinite number of products in the example of the ideal low-pass response indicated, the same result may be approached to any necessary degree of accuracy by the use of finite length impulse response functions, this corresponding to the use of an n-tap FIR (finite impulse response) digital filter, which may be designed to exhibit an appropriate frequency response using well-known techniques. The impulse response curve is defined by the sets of amplitude values occurring at the sample points as determined by the positions of the value y(t) being reconstructed. These sets of values may be stored as coefficient values to be applied to a transversal filter. FIG. 7 illustrates a sample rate converter which is based on the above principle. In FIG. 7, 30 denotes each stage of a shift register which has n stages (n may be 32). The output of each stage 30 is fed through a digital multiplier 31 to a summer 32. Each digital multiplier 31 also receives a multiplication coefficient (which depends on the particular stage 30 and the intersampling position) from a memory device schematically designated at 33. The actual set of coefficient values applied to the multiplier 31 to construct any arbitrary new sample position are derived from tabulated values held in addressable memory devices, these tables defining the finite impulse response function. The address applied to these devices corresponds to the position of the desired new sample point relative to the, closest original sample points, this relative position being obtained from a map of the new sample points expressed in terms of the original sample pitch. The number of entries in this table obviously increases in proportion to the precision with which this intermediate point needs to be defined, and this consideration dictates the necessary number of address bits.

This method is employed in many applications and constitutes the preferred prior art method of sample-rate conversion. The method does, however, present difficulties in implementation due to the sheer complexity of the hardware when a substantial number of filter taps is required. As a general rule, the greater the number of taps in the filter, the more accurately a given response can be approximated; many applications requiring at least 32 taps to obtain acceptable interpolation accuracy. Although complex digital filter integrated circuits have been produced, these are generally limited to only two sets of pre-defined or pre-loaded coefficients, the advantage of integration only really being obtained when the memory devices can be incorporated on the filter chip. This would demand great complexity. If the number of stages is 32 (i.e. n=32), the number of intersampling positions is 1024 and the number of bits required for multiplication coefficient is, say, 12 then $32 \times 1024 \times 12 = \Omega 400$ k memory bits will be required for the multiplication coefficients together with 32 multipliers, possibly of 12=12 bit accuracy.

SUMMARY OF THE INVENTION

An object of the present invention is to provide a sample rate converter suitable for converting between digital video formats which does not require as much complex hardware as the prior art sample rate converter already described.

According to the present invention, there is provided a sample rate converter which comprises a first finite impulse response (FIR) digital filter which effects a sampling rate doubling operation, which has a relatively large number of taps and whose output is connected to a second FIR digital filter having a relatively low number of variable coefficient taps, the frequency response of the first FIR digital filter being arranged to compensate for the frequency response of the second FIR digital filter.

In effect the present invention provides a sample rate converter which utilises the fundamental theory previously described but utilises a two-stage process. The sample rate converter according to this invention is capable of producing results of the same accuracy, (i.e. level of distortion) as an FIR digital filter with a substantial number of variable coefficient taps and much greater complexity. The sample rate converter according to this invention can use available FIR digital filter integrated circuits.

In the sample rate converter according to the invention, the second FIR digital filter is effectively a truncated FIR filter based on a relatively low number of taps. There are however provided a relatively large number of intersampling positions for the relatively low number of taps which are provided.

The first FIR digital filter can be a single digital FIR filter but can be a pair of FIR digital filters. In the former case the number of taps will have to be 2n whereas in the second case one FIR digital filter forming the first FIR filter can have n taps and the other n−1 taps. In one example, where the first FIR digital filter is made up of two digital FIR filters, one has 31 taps and the other has 32 taps and each has one intersampling position, whereas the second FIR digital filter has 4 taps and a total of 512 intersampling positions.

DESCRIPTION OF THE DRAWINGS

An embodiment of this invention will now be described with reference to the accompanying drawings.

DESCRIPTION OF THE PREFERRED EMBODIMENT

Figure 1:
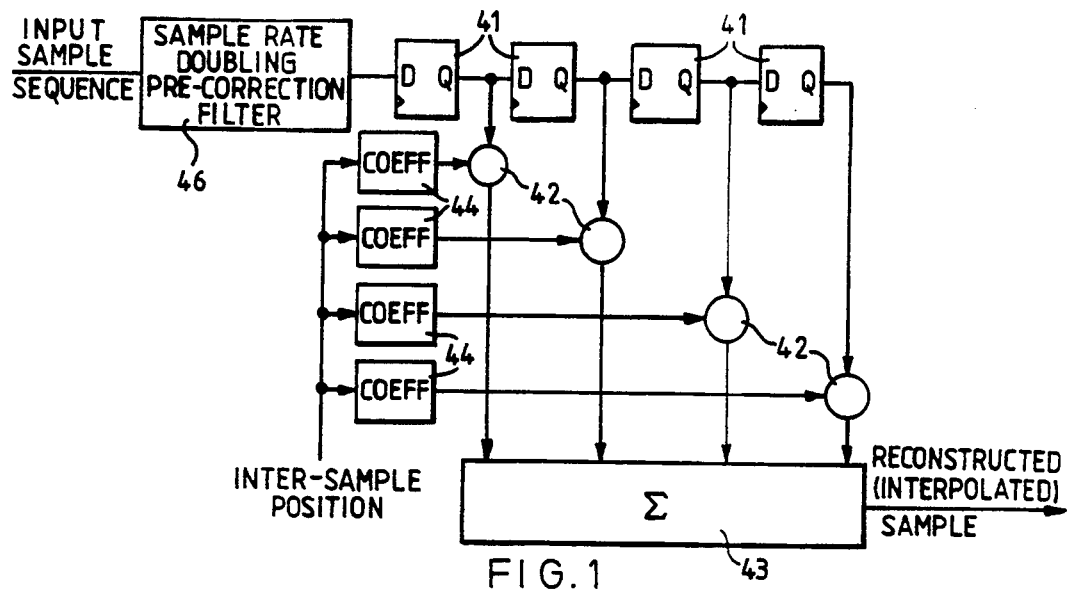
FIG. 1 is a block diagram of a sample rate converter in accordance with this invention.
Figure 2:
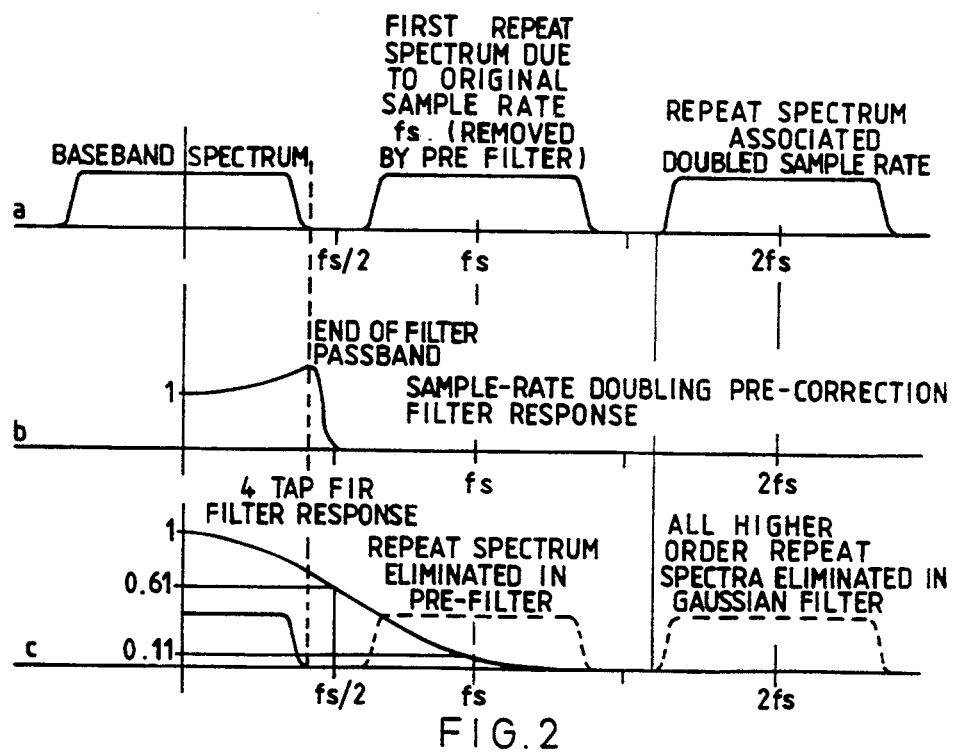
FIG. 2 illustrates frequency domain responses for the converter of FIG. 1.

In the illustrated embodiment of the invention, the input signal sampled at frequency fs, is first input to a first FIR filter 46 (FIG. 1) consisting of either one or of two FIR filters capable of performing a sample-rate doubling operation to a high degree of accuracy while subjecting the input signal to a frequency response correction as shown in FIG. 2 to which reference will be made again. Referring again to FIG. 1, the output of the first sample rate doubling pre-correction FIR filter 46 is fed to a shift register consisting of four stages 41. The output of each stage 41 is multiplied by digital multiplier 42 and is fed to a summer 43.

Figure 7:
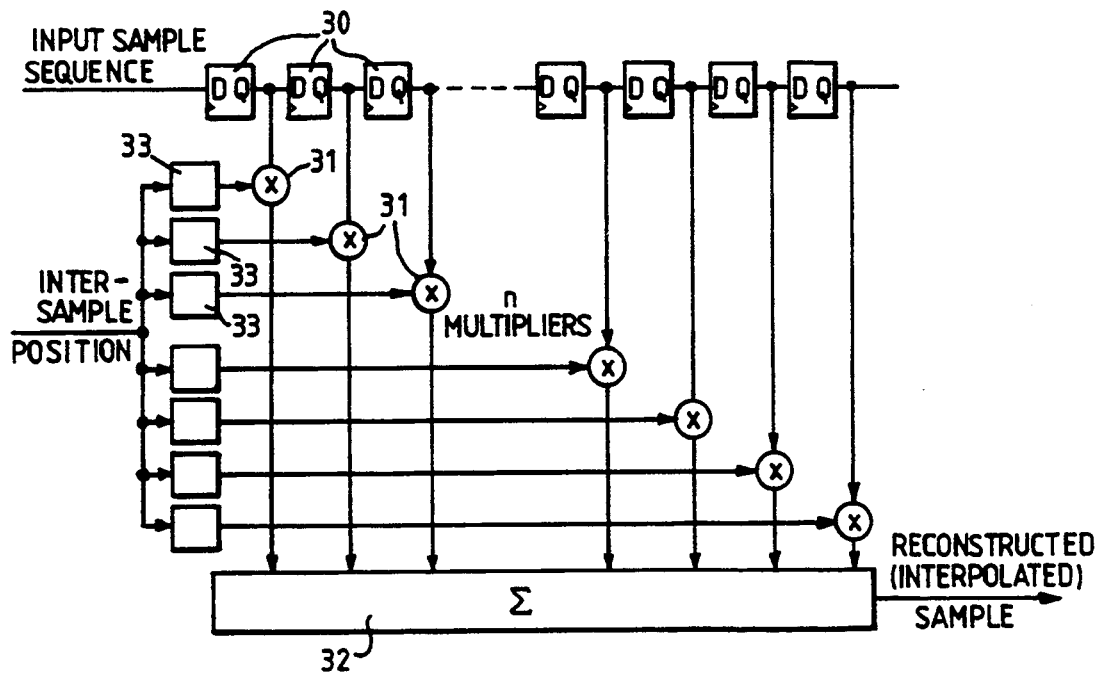
FIG. 7 is a block diagram of a known sample rate converter.

As with the prior art FIR filter illustrated in FIG. 7, each multiplier 42 receives a variable multiplication coefficient (which depends on the particular stage 41 and the intersampling position) from a memory device schematically illustrated at 44. As with the prior art FIR filter there are a large number of intersampling positions and in this example 512. Because there are only four digital multipliers 42, the second FIR filter is not so complex in relation to the FIR filter of the prior art and the size of the memory required for all the multiplication coefficients and number of multipliers and adders required are relatively small.

Because there are only four stages in the FIR filter constituted by the shift register 41, digital multipliers 42 and summer 43 of the second FIR filter of FIG. 1, the filter response is not that desired and is shown by the thick curve of FIG. 2, line c. This characteristic is not that of an ideal low-pass filter though by careful choice of the frequency response it can still fulfill the requirements of an interpolating filter provided the characteristic of the first filter compensates. The filter pass band of the FIR filter 40 is shown in FIG. 2, line c and effectively provides frequency response pre-correction. The filter response of the filter constituted by the shift register having stages 41, the digital multipliers 42 and the summer 43 has, as already stated, the characteristic shown in FIG. 2, line c and it will be seen that beyond the end of the overall filter passband the filter response of the second FIR filter gradually drops to zero before reaching the lowest frequency of the first repeat spectrum centred on 2fs, thereby eliminating the component from the output signal now sampled at 2fs.

Figure 6:
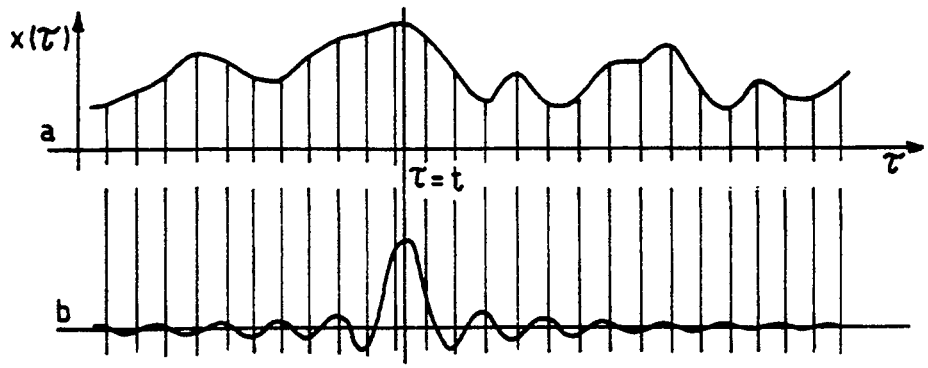
FIG. 6 illustrates graphically the fundamental theory of a finite impulse response FIR digital filter.

The sample-rate doubling operation (that of filter 40) can be carried out either in two n-tap FIR filters, or to the same degree of accuracy in one 2n-tap FIR filter. For the particular application described herein, it is convenient to use two filters, one of 31 taps and the other of 32. Processed samples are alternately produced from the two filters at an overall sample-rate of 2fs, the filter operation conforming to the earlier description except that only one set of coefficients is required in each filter, making the use of purpose-designed integrated circuit filters possible. It may be seen from FIG. 6, line b that, in order to reconstruct a sample value at a point mid-way between two existing sample points, a symmetrical set of an even number of taps and associated coefficients must be used, and that to produce a sample value at a point coincident with an existing sample point, an odd number of taps and coefficients is required. The coefficients in either case can be seen to be samples of the value of the continuous impulse response function h(t), this function in this case corresponding to the pre-correction filter frequency response shown in FIG. 2, line b.

As already explained, the 2fs-sampled and pre-corrected signal is now applied to the four-tap interpolating filter (41, 42, 43, 44) with variable coefficients which is characterised by the frequency response shown in FIG. 2, line c. This frequency response is a close approximation to a Gaussian function, the response values chosen for this application being as follows:

| Freq. | Relative response |
| --- | --- |
| 0 | 1.00 |
| fs/2 | 0.61 |
| fs | 0.11 |
| 3fs/2 and above | 0.00 |

This frequency characteristic is chosen as it exhibits a negligible response to frequencies within the band of the repeat spectrum centred on 2fs and the further spectra at 4fs, 6fs etc.

The pre-correction is designed to maintain the overall frequency response flat to the top of the passband, by taking account of the falling response associated with the Gaussian curve. It is found that the overall response may be kept flat to within +0.01 dB in the passband by careful choice of filter characteristics.

The embodiment of the invention described above can be applied to any sample-rate conversion but is particularly suited to that required in the field of digital video when converting in either direction between the digital component standard known as D1, sampled at 13.5 MHz, and the digital composite standard known as D2, sampled at four times the colour subcarrier frequency (17.734475 MHz in the case of the PAL I colour television standard, and 14.31818 MHz in the case of NTSC M colour television standard).

Figure 3:
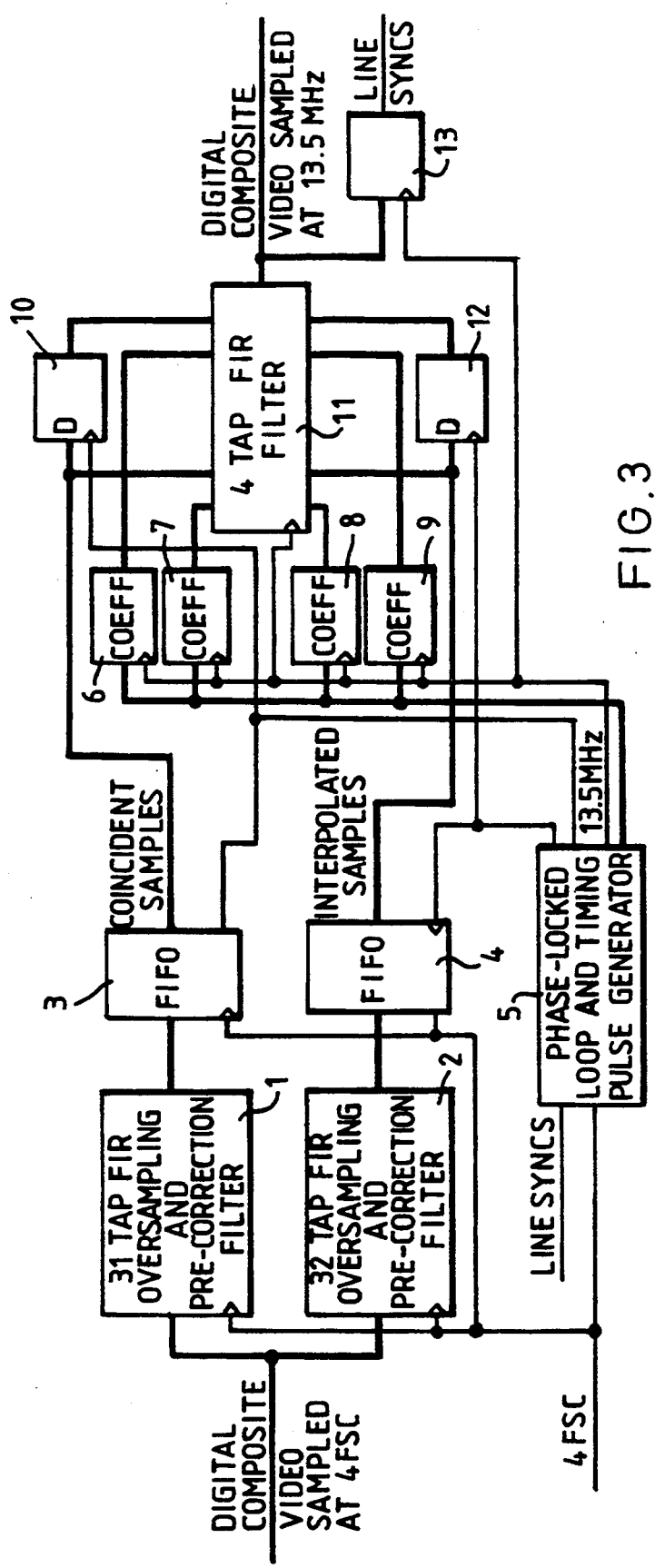
FIG. 3 is a more detailed block diagram of the sample rate converter of FIG. 1.

FIG. 3 shows an embodiment of the invention suitable for the above mentioned sample-rate conversion required when converting the D2 digital composite standard to the D1 digital component standard. This circuit is capable of sample-rate converting a D2 standard based on any of the colour television standards (PAL I, NTSC M, PAL M etc.) to a sample-rate of 13.5 MHz and a similar configuration using the same techniques and components can provide the sample-rate conversion in the reverse direction from the 13.5 MHz D1 sampling frequency to the four times subcarrier sampling frequency of D2.

Eight or ten bit data sampled at four times subcarrier frequency (4fsc) is presented to two parallel FIR digital filters 1 and 2 clocked by the input 4fsc clock. These filters can be programmable FIR digital filter integrated circuits such as M27HC68PFP sold by SGS-Thomson Microelectronics. The 31 tap FIR filter 1 is programmed with an aperture which represents the impulse response equivalent to the frequency response shown in FIG. 2, line $b$ where the reconstructed sample is always coincident with an existing 4fsc sample position. As in FIG. 6, line $b$ the coefficients are given by placing the origin of the impulse response on the desired new sample position which in this case is coincident with an existing sample and observing the values of the response at sample positions offset from the origin by 0, $\pm 1$, $\pm 2$, $\pm 3$, $\pm 4$, etc. input sample periods. In the case of the 32 tap FIR filter 2 the new sample position is always midway between existing sample positions. This is programmed with the same impulse response but contains a symmetrical set of coefficients corresponding to the amplitude of the impulse response function at offsets $\pm 1/2$, $\pm 3/2$, $\pm 5/2$, $\pm 7/2$ etc. input sample periods from the origin.

The two parallel data streams from the coincident and interpolating FIR filters are latched into First In First Out (FIFO) memory devices, 3 and 4, using the input 4fsc clock. The FIFO read clocks are derived by gating a clock at twice the 13.5 MHz clock frequency (27 MHz) in such a way as to produce two clock signals each with an average frequency of 4fsc but with rising clock edges at times corresponding to the rising edges of the 27 MHz clock. The timing of the gate pulses controls which four samples, two from each of the two data streams, make up the four sample aperture from which the new sample at the 13.5 MHz sample-rate will be reconstructed in the 4 tap FIR filter 11. The derivation of these gating pulses is described later.

The coincident and interpolated samples output from the FIFOs are clocked into registers 10 and 12 using the above mentioned FIFO read clocks to make a combined data rate of 8fsc.

The four tap FIR filter 11 in FIG. 3 contains four multipliers and an adder to sum the results of the multiplications. An example of an integrated circuit appropriate for this is the TMC2246 sold by Raytheon. Coefficients from the addressable memory devices 6, 7, 8 and 9, clocked by a 13.5 MHz clock transition, and the four samples on either sides of registers 10 and 12 at the incoming 8fsc sample rate provide the inputs to the multipliers. The timing of read clocks for the FIFOs is such that appropriate samples are presented to the multipliers in time for the next 13.5 MHz transition. The output from the four tap FIR filter is the reconstructed sample at the 13.5 MHz sample-rate.

Whereas in the case of the fixed-coefficient FIR filters the coefficients corresponded to 32 or 31 values based on fixed offsets from the origin, in the case of the four tap filter the entire impulse response is contained in addressable memory devices and the offsets between the desired new sample position and the nearest input sample positions in terms of input sample periods are provided as the addresses, the quantisation accuracy of the offsets being defined by the number of address bits. This address is derived from the phase-locked loop which controls the 13.5 MHz clock, shown as circuit 5 in FIG. 3 and in more detail in FIG. 4.

Figure 4:
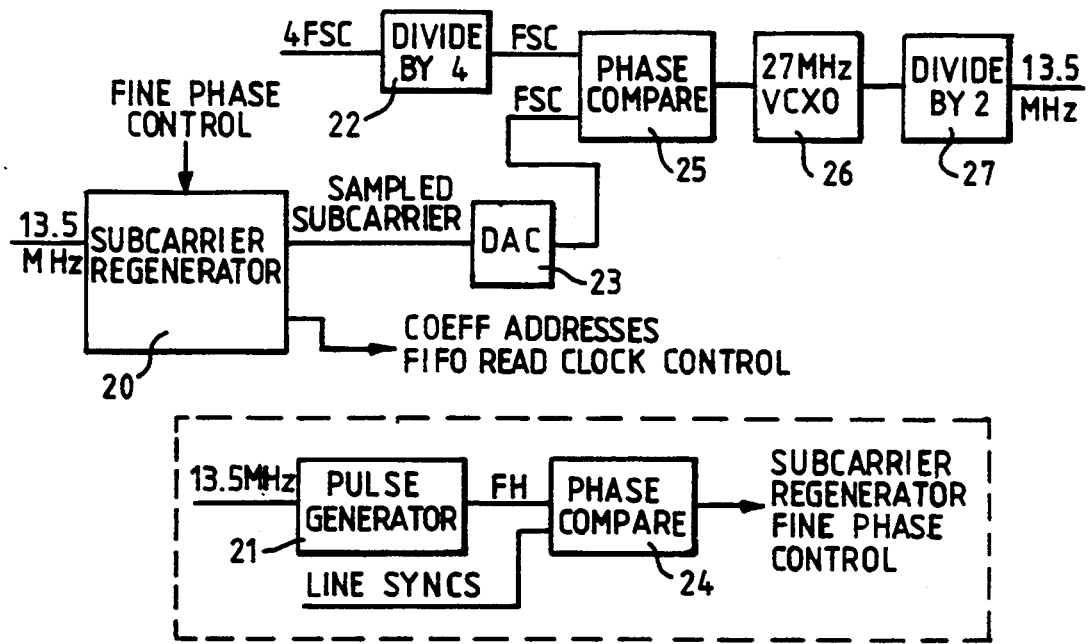
FIG. 4 consists of block diagrams of parts of the converter.
Figure 5:
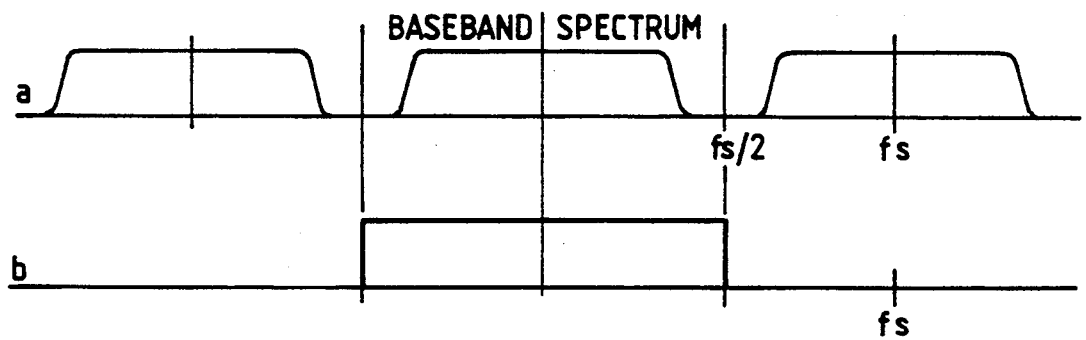
FIG. 5 shows passband spectra of filters.

A subcarrier frequency sinusoidal signal sampled at 13.5 MHz is produced digitally from the 13.5 MHz clock in the subcarrier regenerator 20, in FIG. 4. This is converted to an analogue signal in the digital to analogue converter (DAC) 23, and phase compared to a divided by four version of the incoming 4fsc clock. The result of this phase comparison is used to control the 27 MHz voltage controlled crystal oscillator (VCXO) 26 from which the 13.5 MHz clock is derived, thereby locking the 13.5 MHz clock to the incoming 4fsc clock.

The fine-phase control of the subcarrier regenerator can provide an indirect control of the system line phase. The line phase of the incoming video signal is defined by the synchronising pulses shown as 'line syncs' in FIGS. 3 and 4. In FIG. 3 the sync pulses are extracted from the composite signal and converted in the digital to analogue converter 13. In phase comparator 24 in FIG. 4, 'line syncs' is compared with the system line phase as defined by the internal FH signal, and the difference used to adjust the fine phase control input of the digital subcarrier regenerator 20. Since the regenerated subcarrier is locked to the incoming 4fsc clock signal this has the effect of varying the 13.5 MHz clock frequency until line-lock is achieved. In systems which include further processing of the digital video signal after sample-rate conversion, the pulse generator 21 and phase comparator 24 in FIG. 4 may be incorporated in subsequent circuitry.

The digitally regenerated subcarrier is produced by addressing a programmable device containing a digital representation of a sine wave. By controlling the address increment associated with each 13.5 MHz clock period the frequency of the regenerated sine wave is controlled. This is equivalent to a 13.5 MHz clock sampling an analogue sine wave, for any frequency of sine wave each clock period will produce a predictable phase increment in the analogue waveform. In the case of a sine wave stored in a $2048 \times n$ bit memory device and considering the PAL I television standard where the subcarrier frequency, fsc, is 4.43361875 MHz, the address increment for each 13.5 MHz clock cycle would be 672 with a fractional part of 10064/16875. This is implemented in two counter stages. A modulo 16875 counter increments by 10064 every clock cycle, overflows from this counter add one to the second counter stage, a modulo 2048 counter. When no overflow occurs this counter would increment by 672 every clock cycle, but an overflow from the previous stage causes an increment of 673. The fine phase control input of the digital subcarrier regenerator can add or subtract up to eight from this increment according to the level of line phase error.

A multiplied by eight version of the incrementing address of the subcarrier regenerator defines the relationship between the 13.5 MHz sample position and the frequency-doubled (8fsc) incoming sample positions, and is used to provide the offset address for the coefficient memory devices 6, 7, 8 and 9. In the case of the input being of the PAL I version of D2, the relationship between the 8fsc sample-rate and 13.5 MHz is approximately 2.627:1 so that the multiplied by eight version of the incrementing address of the subcarrier regenerator increments by approximately 2.627 input samples for every 13.5 MHz sample.

The gating pulses used to control the FIFO read clocks are also derived from the subcarrier regenerator address. The least significant non-fractional bit of this multiplied by eight address defines whether the first sample of the four sample aperture is coming from the coincident or interpolated path. Changes in the state of this bit are used to allow extra 27 MHz clock edges in either the coincident or interpolated sample FIFO read clocks to present the nearest four input samples to the desired output sample position and alter which path contains the first of the four input samples.

Although the present invention has been described and illustrated in detail, it is clearly understood that the same is by way of illustration and example only and is not to be taken by way of limitation, the spirit and scope of the present invention being limited only by the terms of the appended claims.

We claim:

1. A sample rate converter which comprises a first finite impulse response (FIR) digital filter which effects a sampling rate doubling operation, which has a relatively large number of taps and whose output is connected to a second FIR digital filter having a relatively low number of variable coefficient taps, the frequency response of the first FIR digital filter being arranged to compensate for the frequency response of the second FIR digital filter.

2. A sample rate converter as claimed in claim 1, wherein the first FIR digital filter is constituted by a single FIR digital filter arranged to perform a filter operation at each sample position and midway between two adjacent sample positions.

3. A sample rate converter as claimed in claim 2, wherein the first FIR digital filter utilises 64 taps.

4. A sample rate converter according to claim 2, wherein the second FIR digital filter has a first store for receiving alternate outputs of the first FIR digital filter and a second store, for receiving the other alternate outputs of the first FIR digital filter, and four digital multipliers, each of which is connected to receive a multiplication coefficient, said first and second digital multipliers being arranged to operate on the input and output, respectively, of the first store and said third and fourth digital multipliers being connected to operate on the input and output, respectively, of the second store.

5. A sample rate converter as claimed in claim 1, wherein the first FIR digital filter comprises a pair of FIR digital filters in parallel, the first of the pair of FIR digital filters being arranged to carry out an FIR filter operation at the sample position and the second of the pair of FIR digital filters being arranged to carry out a filter operation midway between each pair of adjacent sample positions.

6. A sample rate converter as claimed in claim 5, wherein the second FIR digital filter has a first store for receiving the output of the first of the pair of FIR digital filter and a second store for receiving the output of the second of the pair of FIR digital filters and four digital multipliers, each of which is connected to receive a multiplication coefficient, said first and second digital multipliers being arranged to operate on the input and output respectively of the first store and said third and fourth digital multipliers being connected to operate on the input and output, respectively, of the second store.

7. A sample rate converter as claimed in claim 6, wherein the first of the pair of FIR digital filters is a 31 tap FIR digital filter and the second of the pair of FIR digital filters is a 32 tap FIR digital filter.

8. A sample rate converter according to claim 7, wherein the first filter of the pair of FIR digital filters utilises 31 taps and the second filter of the pair of FIR digital filters utilises 32.

9. A sample rate converter as claimed in claim 5, wherein the first of the pair of FIR digital filters is a 31 tap FIR digital filter and the second of the pair of FIR digital filters is a 32 tap FIR digital filter.

10. A sample rate converter according to claim 9, wherein the first filter of the pair of FIR digital filters utilises 31 taps and the second filter of the pair of FIR digital filters utilises 32.

* * * * *